United States Patent [19]

Matsushita

[11] 4,370,564
[45] Jan. 25, 1983

[54] AC SWITCHING DEVICE
[75] Inventor: Yoh Matsushita, Tokyo, Japan
[73] Assignee: Ricoh Company, Ltd., Tokyo, Japan
[21] Appl. No.: 267,931
[22] Filed: May 28, 1981
[30] Foreign Application Priority Data
   Jun. 4, 1980 [JP] Japan .................................. 55-74163
   Jun. 4, 1980 [JP] Japan .................................. 55-74164
[51] Int. Cl.³ .......................... H04B 3/54; H01H 9/54
[52] U.S. Cl. .................................. 307/140; 340/310 A
[58] Field of Search ............................ 307/3, 38, 140;
                                                        340/310 A

[56] References Cited
U.S. PATENT DOCUMENTS
   3,446,991   5/1969   Howell ........................ 307/140 UX
   4,121,113  10/1978   White et al. ..................... 307/140
   4,300,126  11/1981   Gajjar .......................... 340/310 A
   4,328,482   5/1982   Belcher et al. ................ 307/140 X Primary Examiner—Donald A. Griffin
Attorney, Agent, or Firm—David G. Alexander

[57] ABSTRACT

An AC switching device includes a switch element associated with the primary side of a transformer so that the switching element is turned on or off always at a zero-crossing point where the alternating current shifts from predetermined one of the positive and negative phases to the other. The switching element is turned off at a zero-crossing point which occurs immediately after the arrival of a turn-off command signal while it is turned on at a zero-crossing point which occurs after the arrival of a turn-on command and at the same phase of the alternating current as the turn-off phase.

10 Claims, 7 Drawing Figures

AC SWITCHING DEVICE

BACKGROUND OF THE INVENTION

The present invention generally relates to AC switching devices and, more particularly, to an AC switching device of the type which is suitable for switching an AC voltage boosted by a transformer in response to on-off commands delivered thereto.

In a facsimile transceiver for example, a recording sheet undergone development is transferred to a fixing station whereat it is illuminated by flashing light successively by each predetermined width. For this flash fixation, it is necessary to boost a commercial AC voltage by means of a transformer, charge a capacitor with the boosted voltage through a rectifier and then supply the charge from the capacitor to a flash lamp at a predetermined proper timing. This in turn requires that the AC voltage applied to the capacitor or like load be turned on and off at predetermined timings.

For such a supply of a voltage boosted by a transformer for each given period of time at a given timing, it has been a common practice to furnish the secondary winding or side of the transformer with suitable switching means such as a Triac and turn it on and off based on on-off commands at zero-crossing points of the alternating current. A drawback inherent in this type of expedient is that it needs a switch which is resistant to a high voltage and, therefore, costly.

The need of such a costly switch resistant to a high voltage will be precluded if an arrangement is so made as to turn on and off the primary winding side of the transformer instead of the secondary side. However, should the primary side of the transformer be turned on and off at improper timings, the iron core of the transformer would become saturated resulting in the flow of a very large rush or inrush current into the primary side of the transformer. More specifically, if the primary side of the transformer is turned off at a zero-crossing point where the alternating current traverses the zero level from the positive phase to the negative and then turned on at a zero-crossing point where the alternating current traverses the zero level from the negative phase to the positive, the iron core of the transformer will become saturated to allow a rush current of a magnitude which is about 20 times the usual current to flow into the primary side of the transformer. This inflow of a rush current into the primary side cannot be avoided unless the transformer is provided with an iron core which is large enough to prevent the transformer from being saturated even if the on-off timings of the primary side were disturbed. The result is an increase in both of the cost and overall dimensions of AC switching device.

SUMMARY OF THE INVENTION

An AC switching device embodying the present invention comprises a transformer consisting a primary winding to be connected to an AC power source and a secondary winding to be connected to a load, said load producing a turn-on command signal and a turn-off command signal, a switching element connected to the transformer at the primary winding for turning on and off an alternating current from the AC power source, zero-crossing point detecting means connected to the transformer at the primary winding for detecting a zero-crossing point where the alternating current shifts from a predetermined one of positive and negative phases to the other to produce a zero-crossing point detection signal, and control means responsive to the turn-on and turn-off command signals to control the switching element to be turned on and off respectively always at said zero-crossing point in synchronism with the zero-crossing point detection signal.

It is an object of the present invention to provide a small-sized incostly AC switching device which precludes all of the drawbacks inherent in the prior art device discussed above.

It is another object of the present invention to provide an AC switching device which shows a sharp response to an on-off command signal and performs switching actions with accuracy.

It is another object of the present invention to provide a generally improved AC switching device.

Other objects, together with the foregoing, are attained in the embodiments described in the following description and illustrated in the accompanying drawings.

DESCRIPTION OF THE PREFERRED EMBODIMENTS

While the AC switching device of the present invention is susceptible of numerous physical embodiments, depending upon the environment and requirements of use, substantial numbers of the herein shown described embodiments have been made, tested and used, and all have performed in an eminently satisfactory manner.

Figure 1:
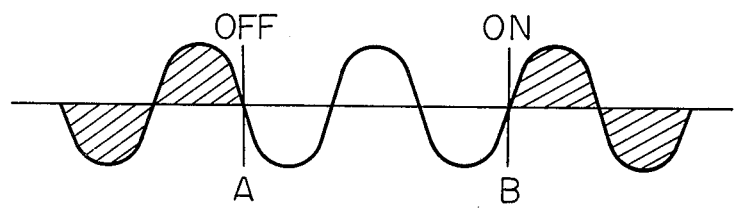
FIG. 1 shows the waveform of an alternating current which is explanatory of operation of a prior art AC switching device.

Referring first to FIG. 1 of the drawings, there is shown an AC waveform which demonstrates operation of a prior art AC switching device. As shown, the operation is such that the primary side of a boosting transformer is turned on and off at different zero-crossing points of the alternating current, that is, it is turned off at a zero-crossing point A where the alternating current shifts from the positive phase to the negative and turned on at a zero-crossing point B where the current shifts from the negative phase to the positive. However, this causes the iron core of the transformer to become saturated and thereby permits a rush current which is about 20 times the usual current to flow into the primary side of the transformer. To settle this problem concerned with the rush current, the transformer must be furnished with an iron core which is large enough to avoid saturation of the transformer against any disturbance to the on-off timings. The result is an increase in both of the cost and overall dimensions of the switching device.

Reference will now be made to FIGS. 2–7 for describing preferred embodiments of the present invention and their modifications which are free from the shortcomings discussed above as inherent in the prior art switching device.

Figure 2:
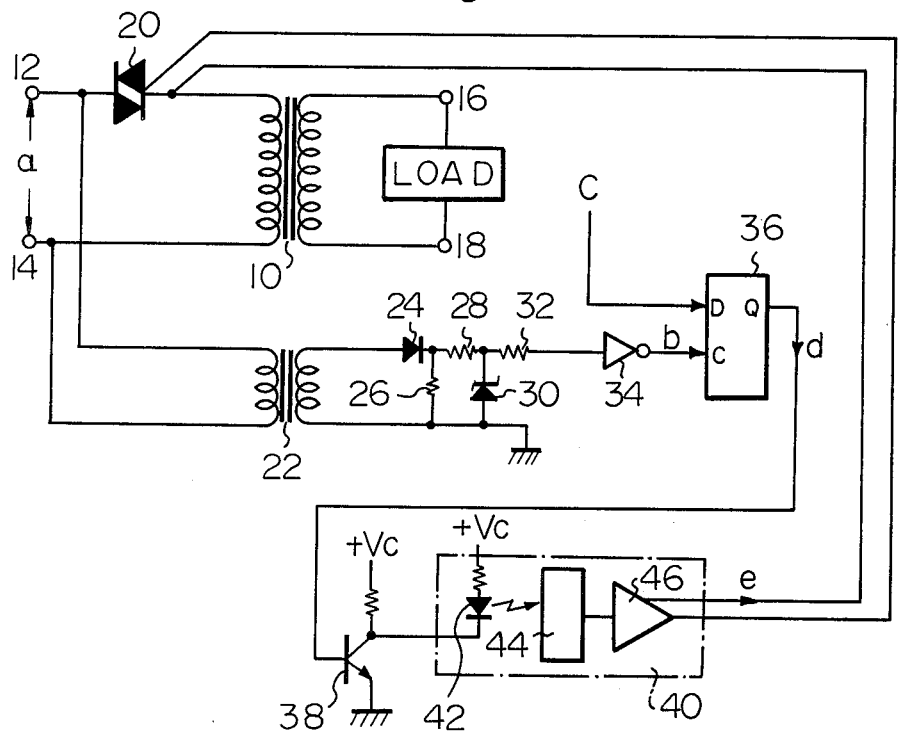
FIG. 2 is a circuit diagram showing an improved AC switching device embodying the present invention.

Referring to FIG. 2, an AC switching device according to a first embodiment of the present invention is illustrated. The reference numeral 10 in FIG. 2 denotes a high tension transformer which boosts a commercial AC voltage supplied across terminals 12 and 14 on its primary side and applies the boosted AC voltage to a load which is connected between terminals 16 and 18 on its secondary side. A Triac 20 is included in the primary side of the transformer 10 to turn on and off the alternating current on the primary side. The primary side of the transformer 10 is connected to the primary side of a small-sized second transformer 22 which joins in the formation of signals. The secondary side of the transformer 22 is connected to a clock input terminal C of a D flip-flop 36 by way of a half-wave rectifier made up of a diode 24 and a resistor 26, a limiter made up of a resistor 28 and a Zener diode 30, a resistor 32 and an inverter 34. A set output terminal Q of the flip-flop 36 connects to the base of a transistor 38 whose collector in turn connects to a gate control circuit 40 for controlling the Triac 20. In the illustrated embodiment, the gate control circuit 40 comprises a photocoupler in the form of a combination of a light emitting element 42 and a light receiving element 44, and a gate circuit 46. If desired, however, the photocoupler may be replaced by a pulse transformer.

Figure 3:
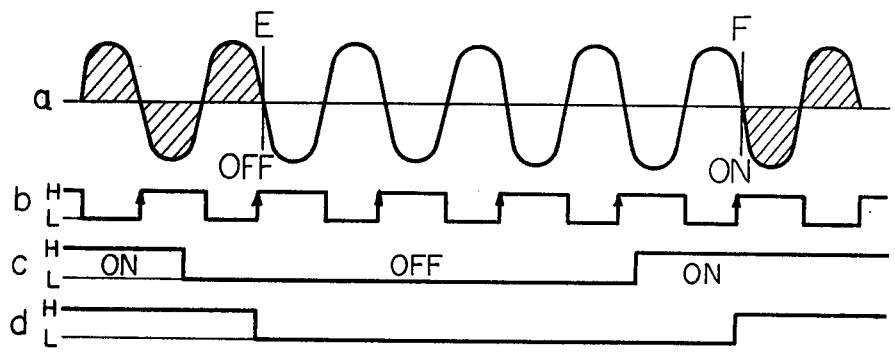
FIG. 3 shows waveforms of signals which appear in various sections of the device indicated in FIG. 2.

With the thus constructed AC switching device, the AC voltage procesed by the transformer 22 is constantly supplied to the clock terminal C of the flip-flop 36 via the half-wave rectifier 24, 26, limiter 28, 30, resistor 32 and inverter 34. The input at the clock terminal C therefore is a train of zero-crossing pulses b as shown in FIG. 3 which are synchronous with but opposite in phase to the AC input across the terminals 12 and 14.

The D input terminal of the flip-flop 36 is supplied with an on-off command signal c from the load. When the on-off command signal c changes its level from "H" commanding a turn-on of the Triac 20 to "L" commanding a turn-off of the same the flip-flop 36 is reset in synchronism with the buildup of a zero-crossing pulse b coupled to its C input terminal and its output d at the set output terminal Q is changed from "H" level to "L" level. As a result, the transistor 38 and therefore the photocoupler 42, 44 are deactivated so that the output e of the gate circuit 46 disappears. Then the Traic 20 is turned off at a zero-crossing point E as shown in FIG. 3 where the alternating current a makes a transit across the zero level from the positive phase to the negative.

When the on-off command signal c again changes its level from "L" to "H" to meet a demand at the load which is connected with the secondary side of the transformer 10, the flip-flop 36 is set in synchronism with the buildup of a zero-crossing pulse b coupled thereto from the inverter 34. The level of the output d at the set output terminal Q is then changed from "L" to "H". The transistor 38 is again rendered conductive by this "H" level input and the photocoupler 42, 44 is activated so that the gate circuit 46 supplies its output e to the Triac 20. Consequently, the Triac 20 is turned on at a zero-crossing point F as shown in FIG. 3 where the alternating current traverses the zero level from the positive phase to the negative as in the case of a turn-off already described. The residual magnetic field stored in the iron core of the transformer 10 during the turn-off period is cancelled by the current which flows upon the turn-on of the Triac 20. It will thus be seen that the iron core of the transformer 10 is prevented from being saturated and it can perform the expected function in the normal way.

In the arrangement shown in FIG. 2, the signal generation circuit for turning on and off the Triac 20 at predetermined timings includes the transformer 22 in addition to the gate control circuit 40 and the others and is constructed independently of the Triac 20. Alternatively, the transformer 22 may be omitted to integrate the signal generation circuit with the Triac 20.

Figure 4:
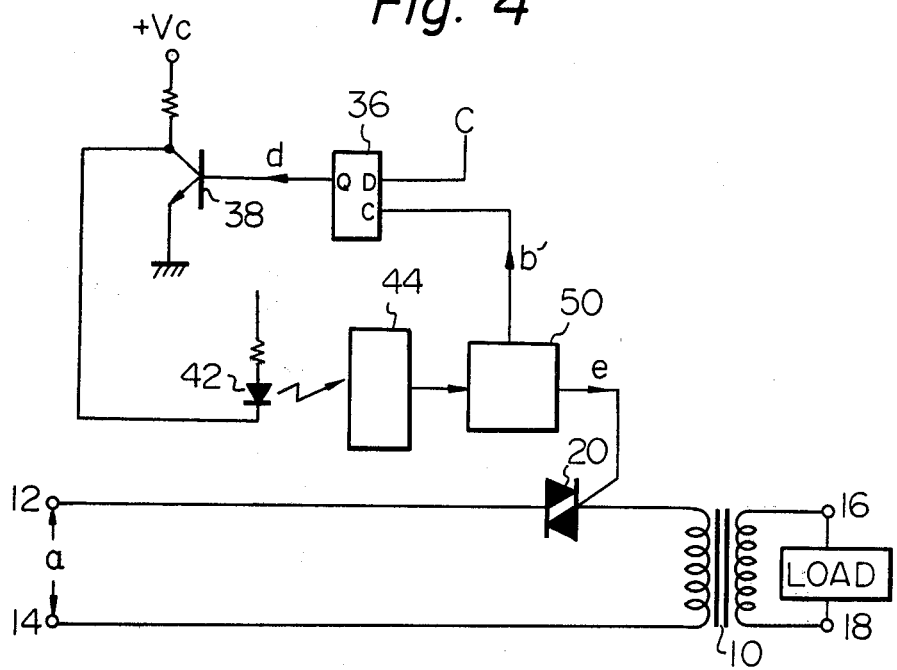
FIG. 4 is a circuit diagram illustrating a modified form of the device shown in FIG. 2.

A modification to the device of FIG. 2 is illustrated in FIG. 4 which embodies the integrated construction of the signal generation circuit and Triac. It should be noted in FIG. 4 that the same reference numerals as those shown in FIG. 2 denote the same or equivalent parts and elements.

In FIG. 4, the modified AC switching device includes a known zero volt ignition circuit designated by the reference numeral 50. The zero volt ignition circuit 50 is adapted to generate a train of zero-crossing pulse b' which correspond to a train of zero-crossing pulses b indicated in FIGS. 2 and 3. The zero-crossing pulses b' from the zero volt ignition circuit 50 are applied to the clock input terminal C of the flip-flop 36. Then, as has been the case with the first embodiment, the gate of the Triac 20 is supplied with an ignition signal e which has its level made "H" and "L" at the same timings as the flip-flop output d shown in FIG. 3 in response to the "H" and "L" levels of the on-off command signal c.

With the arrangement of FIG. 4, the AC switching device achieves an extremely compact design because the signal generation circuit for on-off controlling the Triac 20 can be formed integrally with the Triac 20.

While the first embodiment and its modification have been shown and described as turning on and off the Triac 20 at the zero-crossing points E and F where the alternating current a shifts from the positive phase to the negative, it will be obvious that the Triac 20 may be turned on and off at zero-crossing points where the alternating current shifts from the negative phase to the positive.

As described hereinabove, the first embodiment and its modification are so constructed as to turn on and off the primary side of the transformer always at a zero-crossing point where the alternating current shifts from predetermined one of the opposite phases to the other. This succeeds in preventing the iron core of the transformer from becoming saturated and thereby promotes the use of a relatively cheap switch for low voltages to switch the alternating current which is to be supplied to the load at the secondary side, accurately at a predetermined timing. Apart from the compact and economical design, the AC switching device affords excellent operation by virtue of the switching at zero-crossing points.

Figure 5:
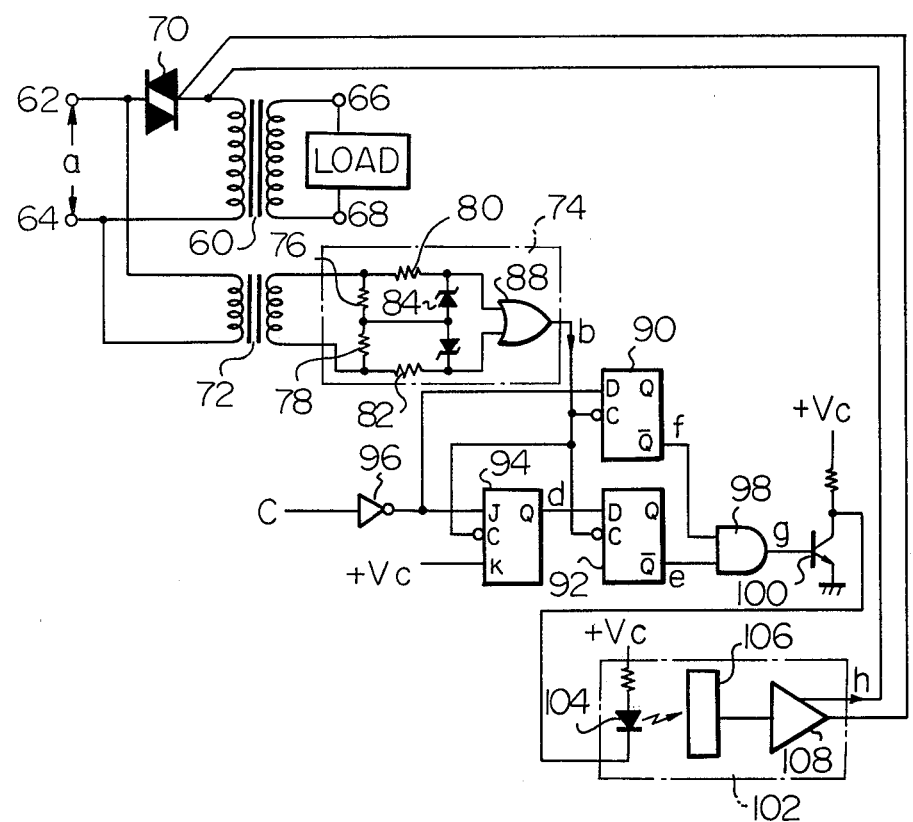
FIG. 5 is a circuit diagram representing a second embodiment of the AC switching device of the present invention.
Figure 6:
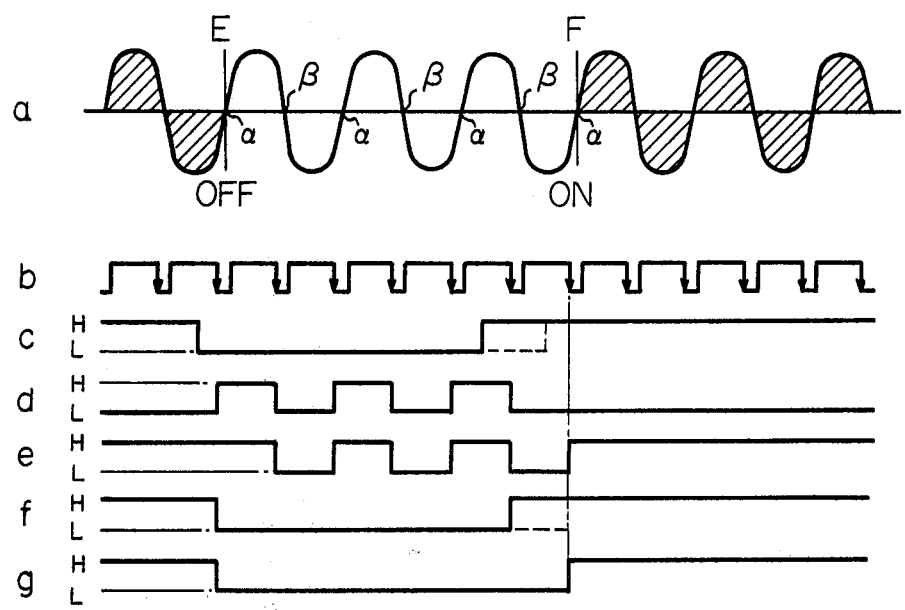
FIG. 6 shows waveforms of signals which appear in various sections of the device indicated in FIG. 5.

Referring to FIG. 5, there is shown a second embodiment of the AC switching device according to the present invention. The reference numeral 60 in FIG. 5 denotes a high tension transformer which boosts a commercial AC voltage supplied across terminals 62 and 64 on its primary side and applies the boosted AC voltage to a load which is connected between terminals 66 and 68 on its secondary side. A Triac 70 is included in the primary side of the transformer 60 to turn on and off the alternating current on the primary side. The primary side of the transformer 60 is connected to the primary side of a small-sized second transformer 72 which joins in the formation of signals. The secondary side of the transformer 72 is connected to a zero-crossing pulse generation network 74 which comprises resistors 76, 78, 80 and 82, Zener diodes 84 and 86 and an OR gate 88 which are connected together as illustrated. As shown in FIG. 6, the zero-crossing pulse generation network 74 produces a train of zero-crossing pulses b which fall substantially at the zero-crossing points of the alternating current a. These output pulses b of the network 74 are supplied as clock pulses to the clock input terminals C of the two D flip-flops 90 and 92 and that C of a J-K flip-flop 94.

An inverter 96 is connected with the D flip-flop 90 and J-K flip-flop 94 so that an inverted version of an on-off command signal c applied to the inverter 96 is coupled to the flip-flops 90 and 94. The J-K flip-flop 94 furnishes the other D flip-flop 92 with outputs d thereof. The flip-flops 90 and 92 individually produce output signals f and e at their $\overline{Q}$ output terminals the levels of which are essentially dependent on the level of the on-off command signal c. These output signals f and e of the flip-flops are delivered through an AND gate 98 to the base of a transistor 100.

The transistor 100 has its collector connected to a gate control circuit 102 adapted to turn on and off the Triac 70 in accordance with an input signal thereof. The gate control circuit 102 comprises a photocoupler made up of a light emitting element 104 and a light receiving element 106 and a gate circuit 108. If desired, however, the photocoupler may be replaced by a pulse transformer.

With the AC switching device thus constructed, the individual flip-flops, 90, 92 and 94 constantly receive at their C terminals the outputs of the OR gate 88, i.e. zero-crossing pulses or clock pulses b synchronous with the alternating current a as shown in FIG. 6.

When the on-off command signal c coupled to the inverter 96 changes its level from "H" to "L" to turn off the Triac 70, the signal level at the D input terminal of the flip-flop 90 and that at the J input terminal of the flip-flop 94 are commonly changed from "L" to "H". The flipflop 90 therefore is set immediately at the fall of a clock pulse b supplied to its C input terminal. Then the signal level f at the $\overline{Q}$ terminal of the flip-flop 90 turns from "H" to "L". This makes the output g of the AND gate 98 "L" in level and thereby renders the transistors 100 non-conductive. Accordingly, the output h of the gate circuit 108 of the gate control circuit disappears to turn off the Triac 70. Such a turn-off occurs in the embodiments of FIG. 6 at a zero-crossing point E where the alternating current a traverses the zero level from the negative phase to the positive.

Meanwhile, the flip-flop 94 is also set at the fall of the clock pulse b to make the signal level d at the Q terminal thereof "H". Thereafter, as long the signal level at the J input terminal remains "H", the flip-flop 94 inverts its state every time a clock pulse b arrives thereat and recovers the initial state at each phase $\beta$ of the alternating current a. Receiving the Q outputs d of the flip-flop 94, the flip-flop 92 also inverts its state every time a clock pulse b is supplied thereto. It is important here to note that the flip-flop 92 starts reversing the state delayed by one duration or cycle of clock pulses b, that is, by a half cycle of the alternating current a from the flip-flop 94. The flip-flop 92 therefore recovers the initial state at every phase $\alpha$ of the alternating current a. Stated another way, the flip-flop 92 memorizes the phase $\alpha$ of the alternating current a at which the Triac has been turned off.

As the input command signal c changes from "L" to "H" in level commanding a turn-on of the Triac 70, it causes the signal levels at the D and J input terminals of the flip-flops 90 and 94 to commonly turn from "H" to "L". Then the flip-flop 90 is reset immediately by the fall of a clock pulse b changing the signal level f at the Q output terminal from "L" back to "H". The flip-flop 94 on the other hand is reset at the fall of a clock pulse b of the phase $\beta$ to make the signal level d at the Q output terminal "L" in level. This state of the flip-flop 94 is maintained thereafter. The flip-flop 92 is reset at the fall of a clock pulse b of the phase $\alpha$ whereby its output e is changed from "L" to "H". This state of the flip-flop 92 is also maintained thereafter. It will therefore be understood that the result is the same even though the on-off command signal c may change its level from "L" to "H" at a point which is delayed from the point concerned as indicated by a phantom line in FIG. 6.

At this time instant, the output g of the AND gate 98 is changed from "L" to "H" in level to turn on the transistor 100 whereby the gate control circuit 102 is activated to ignite the Triac 70. Consequently, this turn-on of the Triac 70 takes place at the same phase $\alpha$ as the phase at which it has been turned off. The residual magnetic field stored in the iron core of the transformer 60 during the turn-off period is cancelled by the current which flows upon the turn-on of the Triac 70, the iron core performing the expected function normally without any saturation.

In the second embodiment described hereinabove, the signal generation circuit for turning on and off the Triac 70 at predetermined timings includes the transformer 72 in addition to the gate control circuit 102 and the others and is constructed independently of the Triac 70. Again, however, the transformer 72 may be omitted to integrate the signal generation circuit with the Triac 70.

Figure 7:
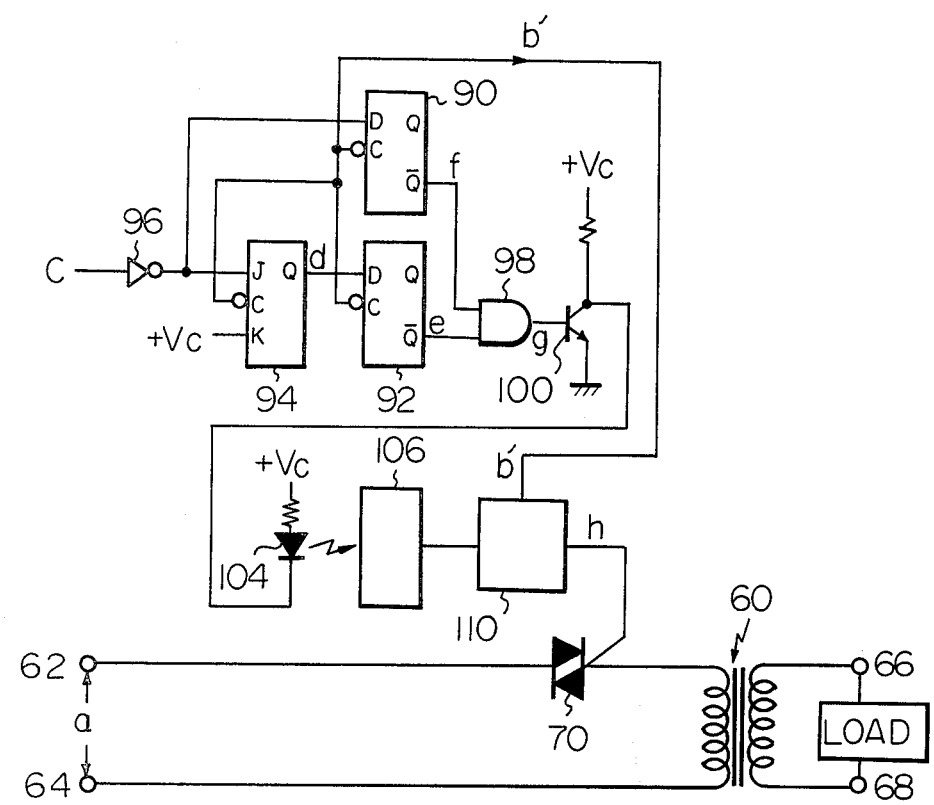
FIG. 7 is a circuit diagram illustrating a modified form of the device shown in FIG. 5.

A modification to the device of FIG. 5 is illustrated in FIG. 7 which embodies the integrated construction of the signal generation circuit and Triac. It should be noted in FIG. 7 that the same reference numerals as those shown in FIG. 5 denote the same or equivalent parts and elements.

In FIG. 7, the modified AC switching device includes a known zero volt ignition circuit designated by the reference numeral 110. The zero volt ignition circuit 110 is adapted to generate a train of zero-crossing pulses b' which correspond to a train of zero-crossing pulses b indicated in FIGS. 5 and 6. The zero-crossing pulses b' from the zero volt ignition circuit are applied to the clock terminals C of the individual flip-flops 90, 92 and 94. Then, as has been the case with the second embodiment, the gate of the Triac 70 is supplied with an ignition signal h which has its level made "H" and "L" at the same timings as the AND gate output g shown in FIG. 6 in response to the "H" and "L" levels of the on-off command signal c.

With the modified form shown in FIG. 7, the AC switching device becomes very compact in construction because the signal generation circuit for turning on and off the Triac 70 can be integrated with the Triac 70.

Thus, the AC switching device according to the second embodiment or its modification turns off the primary side of the transformer at a zero-crossing point of the alternating current which occurs immediately after the supply of a turn-off command. It will therefore be appreciated that the alternating current supplied to the load can be turned off without accompanying any noise of high frequency and within a time period shorter than a half cycle of the alternating current at the maximum after the supply of a turn-off command. Also, the AC switching device memorizes the phase of the alternating current at the time of a turn-off and turns on the primary side at a zero-crossing point corresponding to the memorized phase when the next turn-on command is supplied. This permits the transformer to perform its boosting function successfully without having its iron core saturated, allowing the use of an incostly switch for low voltages. The AC switching device is thus compact in design, low in cost and excellent in operation.

Various modifications will become possible for those skilled in the art after receiving the teachings of the present disclosure without departing from the scope thereof.

What is claimed is:

1. An AC switching device comprising:
  a transformer consisting a primary winding to be connected to an AC power source and a secondary winding to be connected to a load, said load producing a turn-on command signal and a turn-off command signal;
  a switching element connected to the transformer at the primary winding for turning on and off an alternating current from the AC power source;
  zero-crossing point detecting means connected to the transformer at the primary winding for detecting a zero-crossing point where the alternating current shifts from a predetermined one of positive and negative phases to the other to produce a zero-crossing point detection signal; and
  control means responsive to the turn-on and turn-off command signals to control the switching element to be turned on and off respectively always at said zero-crossing point in synchronism with the zero-crossing point detection signal.

2. An AC switching device as claimed in claim 1, in which a switching element comprises a Triac.

3. An AC switching device as claimed in claim 1, in which the zero-crossing point detecting means comprises zero volt ignition circuit for controlling the switching element.

4. An AC switching device comprising:
  a transformer consisting a primary winding to be connected to an AC power source and a secondary winding to be connected to a load, said load producing a turn-on command signal and a turn-off command signal;
  a switching element connected to the transformer at the primary winding for turning on and off an alternating current from the AC power source;
  zero-crossing point detecting means connected to the transformer at the primary winding for detecting a zero-crossing point where the alternating current shifts from a predetermined one of positive and negative phases to the other to produce a zero-crossing point detection signal; and
  control means responsive to the turn-on and turn-off command signals to control the switching element to be turned on and off respectively always at said zero-crossing point in synchronism with the zero-crossing point detection signal;
  said control means being constructed to control the switching element to be turned off at a zero-crossing point which occurs immediately after receiving the turn-off command signal and turned on at a zero-crossing point which occurs after receiving the turn-on command signal and at the same phase of the alternating current as the turn-off phase.

5. An AC switching device as claimed in claim 4, in which the switching element comprises a Triac.

6. An AC switching device as claimed in claim 4, in which the control means comprises a memory for storing a turn-off zero-crossing point and the turn-off phase.

7. An AC switching device comprising:
  a transformer consisting a primary winding to be connected to an AC power source and a secondary winding to be connected to a load, said load producing a turn-on command signal and a turn-off command signal;
  a switching element connected to the transformer at the primary winding for turning on and off an alternating current from the AC power source;
  zero-crossing point detecting means connected to the transformer at the primary winding for detecting a zero-crossing point where the alternating current shifts from a predetermined one of positive and negative phases to the other to produce a zero-crossing point detection signal; and
  control means responsive to the turn-on and turn-off command signals to control the switching element to be turned on and off respectively always at said zero-crossing point in synchronism with the zero-crossing point detection signal;
  the zero-crossing point detecting means comprising an auxiliary transformer consisting a primary winding connected to the AC power source and a secondary winding, a half-wave rectifier connected to the secondary winding of the auxiliary transformer, a limiter connected to the half-wave rectifier and an inverter.

8. An AC switching device as claimed in claim 7, in which the control means comprises a flip-flop connected to the inverter to produce an output in response to the turn-on or turn-off command signal from the load and switching element gate control means connected to the flip-flop.

9. An AC switching device as claimed in claim 8, in which the switching element gate control means comprises a photocoupler responsive to the output of the flip-flop and a gate means.

10. An AC switching device as claimed in claim 8, in which the switching element gate control means comprises a pulse transformer.

* * * * *